United States Patent [19]
Griffith

[11] 4,330,723
[45] May 18, 1982

[54] TRANSISTOR LOGIC OUTPUT DEVICE FOR DIVERSION OF MILLER CURRENT

[75] Inventor: Paul J. Griffith, Portland, Me.

[73] Assignee: Fairchild Camera and Instrument Corporation, Mountain View, Calif.

[21] Appl. No.: 65,991

[22] Filed: Aug. 13, 1979

[51] Int. Cl.³ .............. H03K 19/013; H03K 19/088; H03K 19/084; H03K 5/12
[52] U.S. Cl. ................... 307/456; 307/443; 307/458; 307/300; 307/544
[58] Field of Search ............... 307/443, 456–458, 307/280, 300, 317 A, 270, 544, 549, 560, 551

[56] References Cited

U.S. PATENT DOCUMENTS

| | | | |
|---|---|---|---|
| 3,437,831 | 4/1969 | Seelbach et al. | 307/456 |
| 3,641,362 | 2/1972 | Gamble | 307/456 |
| 3,641,368 | 2/1972 | Gamble et al. | 307/456 |
| 3,824,408 | 7/1974 | Brunel | 307/457 |
| 3,867,644 | 2/1975 | Cline | 307/456 |
| 3,958,136 | 5/1976 | Schroeder | 307/270 X |
| 3,999,080 | 12/1976 | Weathersby, Jr. et al. | 307/456 |
| 4,037,115 | 7/1977 | Lee | 307/456 |
| 4,092,551 | 5/1978 | Howard et al. | 307/270 X |
| 4,132,906 | 1/1979 | Griffith | 307/443 |
| 4,178,521 | 12/1979 | Speth | 307/270 |

FOREIGN PATENT DOCUMENTS 101650 8/1979 Japan .................... 307/458

Primary Examiner—Larry N. Anagnos
Attorney, Agent, or Firm—Paul J. Winters; Theodore S. Park; Warren M. Becker

[57] ABSTRACT

A transistor logic output device is provided with an active element discharging transistor coupled between the base of the pulldown element transistor and ground or low potential for actively controlling a route to ground or low potential for diverting and discharging the so-called capacitive feedback Miller current generated during the low to high potential transition at the output of the device resulting from base-collector junction capacitance in the pulldown element transistor. The active element discharging transistor is controlled at its base by the potential at the collector of the phase splitter element and is coupled to follow changes in voltage at the phase splitter collector for receiving base drive current during the transition from low to high potential at the device output and when the phase splitter is not conducting. The active element thereby provides a low impedance path to ground or low potential at the base of the pulldown element transistor means for diverting and discharging the capacitive Miller feedback current. When the phase splitter is conducting, the active element discharge transistor is deprived of base drive current and affords a high impedance.

6 Claims, 6 Drawing Figures

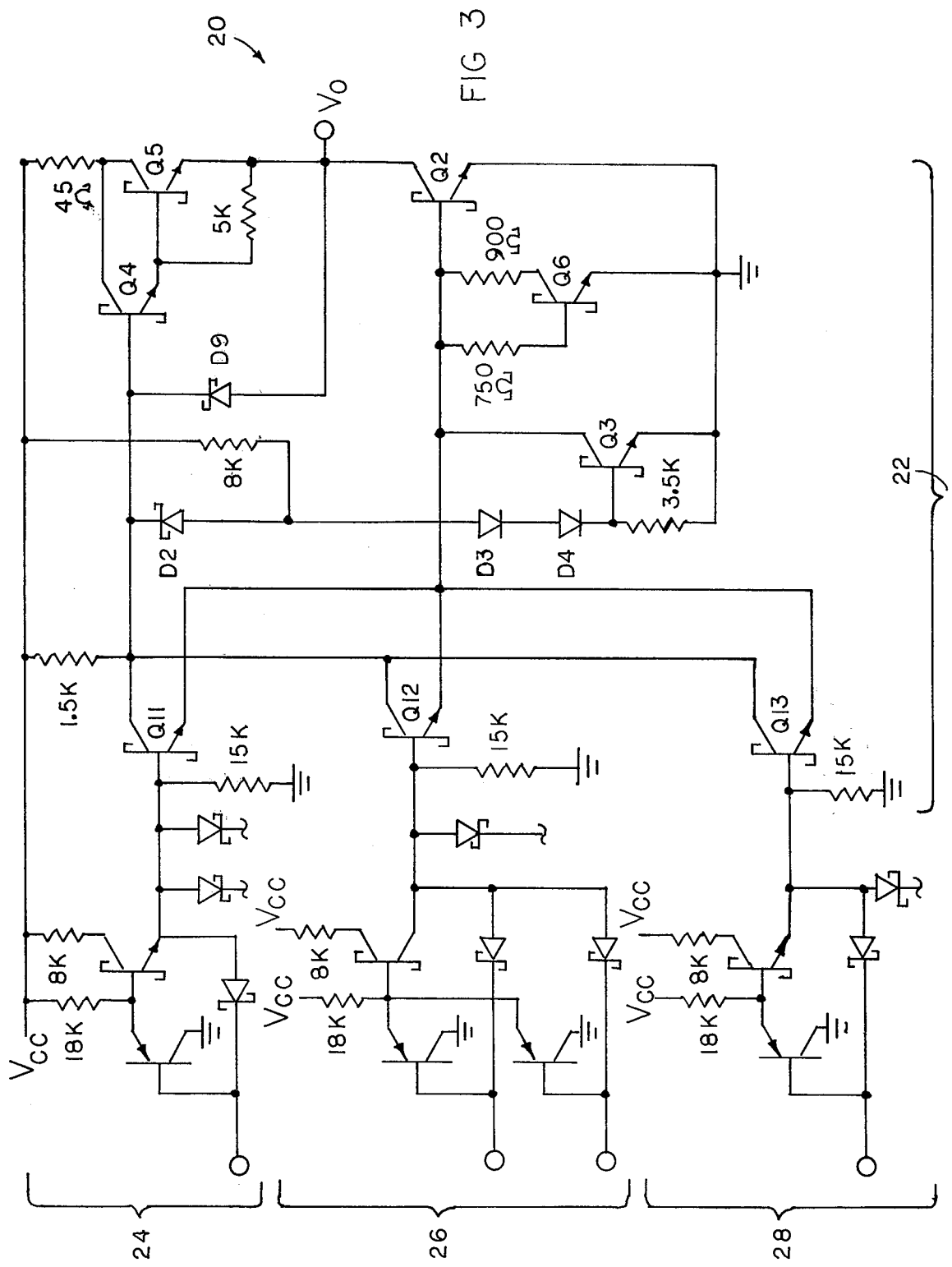

TRANSISTOR LOGIC OUTPUT DEVICE FOR DIVERSION OF MILLER CURRENT

FIELD OF THE INVENTION

This invention relates to a new and improved transistor logic output device for transistor logic circuits, which reduces power consumption and increases switching speed during the transition from low to high potential at the output of the device. In particular, the present invention is contemplated for use in TTL and DTL integrated circuits and is directed to eliminating the problems caused by so-called parasitic "Miller current" which retards turn-off of the pulldown element during transition from low to high potential at the output gate.

BACKGROUND OF THE INVENTION

In conventional transistor-transistor logic (TTL) and diode-transistor logic (DTL) devices, logical values corresponding to binary "1" and "0" are ordinarily represented at the output by a high level voltage $V_{oh}$, for example greater than 2.4 volts, and a low level voltage $V_{ol}$, for example less than 0.8 volts. In positive logic, the high level binary "1" is derived from a voltage source $V_{cc}$ which "sources" the current to the output when a binary "1" is to be delivered by the output gate. When a binary "0" is required at the output, the output gate blocks sourcing current and instead "sinks" the current from the output load to ground so that the low level voltage $V_{ol}$ appears at the output of the logic gate. Thus, the typical TTL output gate functions by "sourcing" and "sinking" current at the output according to whether a binary "1" (high level voltage) or a binary "0" (low level voltage) is the desired outcome of previously executed logical operations. In negative logic the representation of binary 1 and 0 by high and low level voltage is reversed.

A conventional low power Schottky TTL output device is illustrated in FIG. 1. Several elements or stages can be identified in such a TTL output gate. The "pullup" element for sourcing current from the higher level voltage $V_{cc}$ and delivering binary 1 consists of transistors Q4 and Q5 forming a Darlington transistor pair that can supply a relatively large current between the high level voltage source $V_{cc}$ and the output $V_o$ when a much smaller current is applied to the base of Q4. The "pulldown" element or stage for sinking current and voltage from the output to ground consists of transistor Q2 with conventional squaring network at its base comprised of resistors R6 and R7 and transistor Q6. The phase splitter element or stage consists of transistor Q1 which receives the data signal input to the gate in the form of a high or low level voltage at $V_i$ and controls the pullup and pulldown elements for either sourcing or sinking current at the output $V_o$ as determined by the data signal input to the gate.

When a low level voltage or potential appears at the input $V_i$, a low voltage also appears at the base of phase splitter transistor Q1 and this transistor is deprived of base drive current so that it no longer conducts current through its collector to emitter thereby turning off pulldown transistor Q2. Ideally, the output $V_o$ of the gate is therefore isolated from ground. At the same time, because Q1 is non-conducting, the high level voltage $V_{cc}$ appears at the base of sourcing transistor Q4 supplying base current for transistor Q4 to conduct to the base of Q5 which in turn becomes conducting and "sources" current from $V_{cc}$ to the output $V_o$. The TTL logic gate is therefore inherently inverting as a binary 0 at the input $V_i$ represented by a low voltage level generates a binary 1 at the output represented by voltage level $V_{oh}$.

When a binary 1 appears at the input, current from R1 supplies base drive to transistor Q1, Q1 becomes conducting, sinking current from the base of Q4 and therefore turning off the Darlington transistor current source represented by transistors Q4 and Q5. Current from high level voltage $V_{cc}$ is therefore no longer sourced to the output. At the same time, pulldown transistor Q2 becomes conducting through its collector to emitter to ground as a result of the current applied to its base and begins to discharge current from whatever load capacitance may be coupled to the output $V_o$ of the gate, bringing the output $V_o$ to a low level potential corresponding to binary 0. The output load is mainly capacitive.

As shown in FIG. 1 and in later figures, some of the transistor and diode components are typically Schottky diodes and transistors indicated by the opposite square hooks in the schematic symbols. The Schottky clamping effected by an internal modification in these devices produces quicker turnoff during switching. A transistor logic output gate of the type illustrated in FIG. 1, however, suffers the disadvantage of high power consumption and retarded switching during transition from low to high potential at the output as hereafter described.

The problem addressed by the present invention arises during this transition from low to high level voltage at the output in state of the art transistor logic output devices such as that illustrated in FIG. 1. In the ideal situation during low to high transition at the output, the pulldown element transistor Q2 would turn off completely before a large current begins to flow from the pullup element Darlington transistor current source into the load capacitance. In the actual case, the pulldown element is turning off and the pullup element is turning on over a period of time with overlap so that some of the pullup current flows through the pulldown element to ground instead of into the load capacitance. One result is wasteful consumption of power.

The reason that pulldown element transistor Q2 does not turn off completely is because of the occurrence of parasitic feedback capacitance in transistors, primarily the capacitance associated with the base-collector junction. Since pulldown transistor Q2 is required to conduct large amounts of current in sinking current from the load, it is physically larger than most of the transistors in the circuit and thus has a large base-collector capacitance. The equivalent circuit showing the effect of this base-collector junction capacitance on transistor Q2 is illustrated in FIGS. 1A and 1B where the equivalent feedback capacitance accompanying the junction is shown as $C_{bc}$ connected across the base and collector of transistor Q2. This relatively large base to collector junction capacitance $C_{bc}$ in the pulldown element transistor is known as the "Miller capacitance." When the voltage or potential at the output is rising, a significant amount of current $i_{bc}$ is generated proportional to the rate of change of voltage across the base collector capacitance $C_{bc}$. This current is also referred to as the "Miller current." Some of this Miller current flows into the base of Q2 designated in FIGS. 1A and 1B as $i_b$ which base current is then multiplied by the gain $\beta$ of the transistor Q2 resulting in a large collector current $i_c = \beta i_b$ from Q2. This large current to ground diverts current from the pullup element reducing its effectiveness in charging up the load capacitance. As a result, there is wasteful power consumption and retardation or delay in the turnoff of pulldown element transistor Q2.

For further insight into the problem reference is made to the squaring network of FIG. 1 coupled between the base of pulldown transistor Q2 and ground. The squaring network, consisting of transistor Q6 and resistors R6 and R7, is so named because its function is to square off the transition characteristics of the pulldown transistor. It also is called the "lag circuit" because it stays on a little longer than transistors Q1 and Q2 during transition from low to high at the output when Q1 and Q2 are turning off. When Q2 is conducting, a small current passes through the squaring network saturating Q6. R7 must be large to limit the current flow away from the base of Q2 so that Q2 will not significantly be deprived of base current during the time when Q2 must conduct large current through its collector from the output. When Q1 and Q2 are turning off, R7 and Q6 pull current out of the base of Q2 to turn it off quickly.

The value of resistance R7 must therefore be a tradeoff. It must pass enough current to square off the transition characteristics at the pulldown element. On the other hand, it must still be a large resistance, large enough to restrict current loss to ground so that current to the base of Q2 is not drained or sunk when Q2 is trying to conduct and provide low potential at the output.

It is also frequently the case in conventional TTL and DTL transistor logic output devices that instead of a squaring network, a resistance R7 alone is used coupled between the base of pulldown transistor Q2 and ground to facilitate turn off to Q2 during transition. Similarly, such resistance must be large and in that respect similar to R7 so the discussion here is also applicable.

The impact of this limitation of the squaring network of FIG. 1 and of the pulldown element base to ground turnoff resistance R7 in some conventional transistor logic output devices is presented with reference to FIG. 1B. The objective during transition from low to high potential at the output is to turn off Q2 completely and quickly before the Darlington transistor current source pullup element begins to conduct. Because of the Miller capacitance and Miller current, and because of the high resistance limitations on the squaring network or pulldown transistor base turn off resistance, this is not possible in the conventional circuits of the type illustrated by way of example in FIG. 1. The Miller capacitance $C_{bc}$ is always present at the base collector junction and cannot be eliminated. As shown in FIG. 1B for positive changing voltage during transition from low to high potential at the output current is generated and flows back across $C_{bc}$ in the form of the Miller current $i_{bc}$. This Miller current divides, one portion flowing through the squaring network resistance or the base to ground resistance R7, this portion designated $i_r$. The other portion flows into the base of pulldown transistor Q2 and is designated $i_b$. This portion $i_b$ of the Miller current is multiplied by the gain of transistor Q2 so that Q2 will not turn off but continue to conduct current while the pullup element is trying to deliver current to the output. The result as described above is wasteful power consumption and delay in transition.

It is apparent that the current $i_b$ flowing into the base of Q2 must be eliminated to avoid the harmful effects of the Miller current. This base feedback current $i_b$ equals $i_{bc} - i_r$, that is the Miller current minus the portion diverted through resistance R7, and this could only be done if $i_r$ were equal to or greater than the Miller current $i_{cb}$. However, this condition that $i_r$ be greater than or equal to the Miller current cannot be achieved in the conventional circuits of FIGS. 1 and 2 because resistance R7 must have such a large value for the reasons heretofore described. Q2 will therefore stay on until the voltage at the output stops changing from low to high because the Miller current across the Miller capacitance is proportional to the rate of change of potential across it. During this time, considerable current passes to ground from the pullup element through the amplified collector current of the still conducting pulldown transistor, wasting power.

SUMMARY OF THE INVENTION

It is therefore an object of the present invention to provide a new and improved transistor logic output device with reduced power consumption and improved transition characteristics and speed during the transition from low to high potential at the output of the device.

Another object of the invention is to provide a transistor logic output gate which pulls parasitic Miller capacitance feedback current away from the base of the pulldown element transistor thereby to avoid the $\beta$ gain multiplication of Miller current by the pulldown transistor.

Yet another object of the invention is to provide an active element for controlling the Miller feedback current without otherwise interfering in the circuitry or impairing the function of the transistor logic output device when the output is at low potential.

In order to accomplish these results, the present invention contemplates providing in a transistor logic output gate the improvement comprising an active element having high and low impedance states coupled at the base of the pulldown element transistor means to define a route to ground or low potential of high or low impedance according to the conducting state of the active element; and means for controlling the conducting state of the active element to afford a low impedance to ground for diverting Miller feedback current at the base of the pulldown element during transitions from low to high potential at the output of the device, and for providing a high impedance when the output is at low potential, the pulldown element is conducting, and current is being supplied by the phase splitter element to the base of the pulldown element.

More specifically, the invention contemplates providing in a transistor logic output device the improvement comprising active element discharging transistor means coupled between the base of the pulldown element transistor and ground or low potential for actively controlling a route to ground or low potential for diverting and discharging the so-called capacitive feedback Miller current generated during the low to high potential transition at the output of the device resulting from base-collector junction capacitance in the pulldown element transistor. The active element discharging tranistor is controlled at its base by the potential at the collector of the phase splitter element and is coupled to follow changes in voltage at the phase splitter collector for receiving base drive current during the transition from low to high potential at the device output and when the phase splitter is not conducting, thereby providing a low impedance path to ground or low potential at the base of the pulldown element transistor means for diverting and discharging the capacitive Miller feedback current. On the other hand, when the phase splitter is conducting the active element discharge transistor is deprived of base drive current, becomes non-conducting and affords a high impedance.

From a broader perspective it can be seen that the present invention contemplates means and methods for coupling and following voltage changes at the collector of the phase splitter and affording a low impedance path to ground from the base of the pulldown element when the phase splitter is not conducting for diverting the negative feedback capacitive Miller current at the base of the pulldown element, and affording a high impedance when the phase splitter is conducting. The phase splitter element and active element discharge transistor thus comprise an inversion coupling where one is conducting when the other is not. In the preferred form, the invention therefore contemplates providing an active element discharge transistor means at the base of the pulldown element and controlling the active element discharge transistor through inversion coupling with the phase splitter element.

According to other features of the invention there are provided a plurality of diode means in paths defined by the active element discharging transistor means to prevent the potential drop through said paths from being too small relative to the potential drop through the phase splitter/pulldown element path as hereafter more fully explained.

Other objects features and advantages of the present invention will become apparent in the following specification and accompanying drawings.

DESCRIPTION OF THE PREFERRED EMBODIMENT

Figure 1:
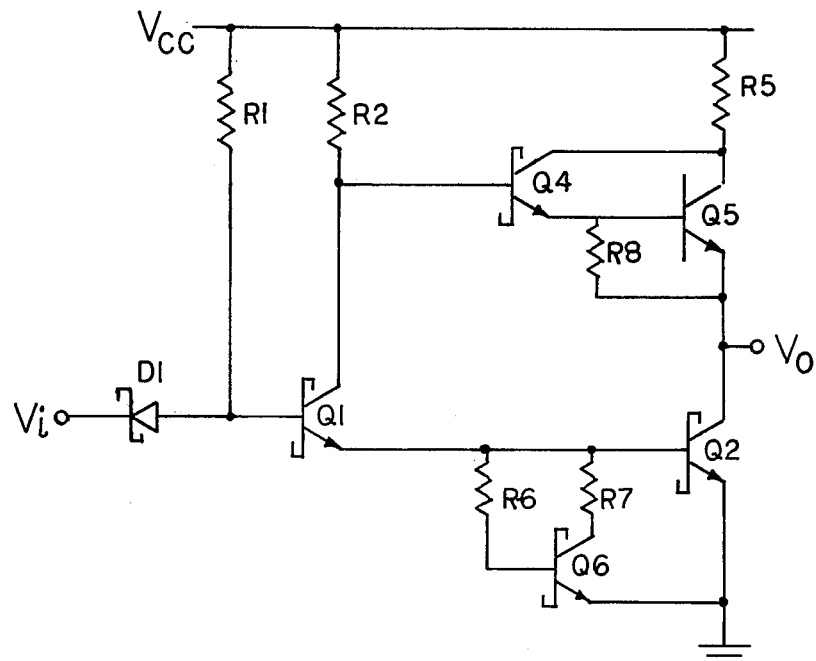
FIG. 1 is a schematic diagram of a low power Schottky transistor logic output gate or device according to the present state of the art.
Figure 1A:
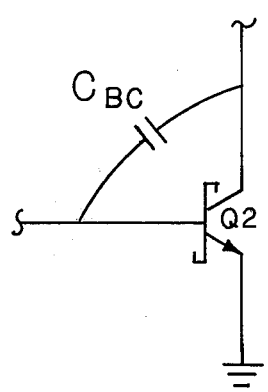
FIG. 1A is a schematic diagram detail of the pulldown element transistor and equivalent Miller capacitance at the base collector junction of the transistor.
Figure 1B:
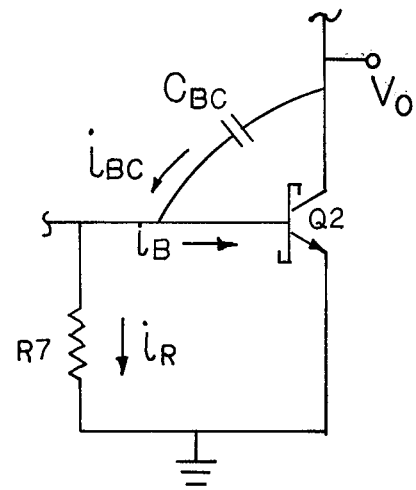
FIG. 1B is a schematic diagram detail similar to FIG. 1A but showing in addition the division of capacitive feedback Miller current at the base of the pulldown transistor.
Figure 2:
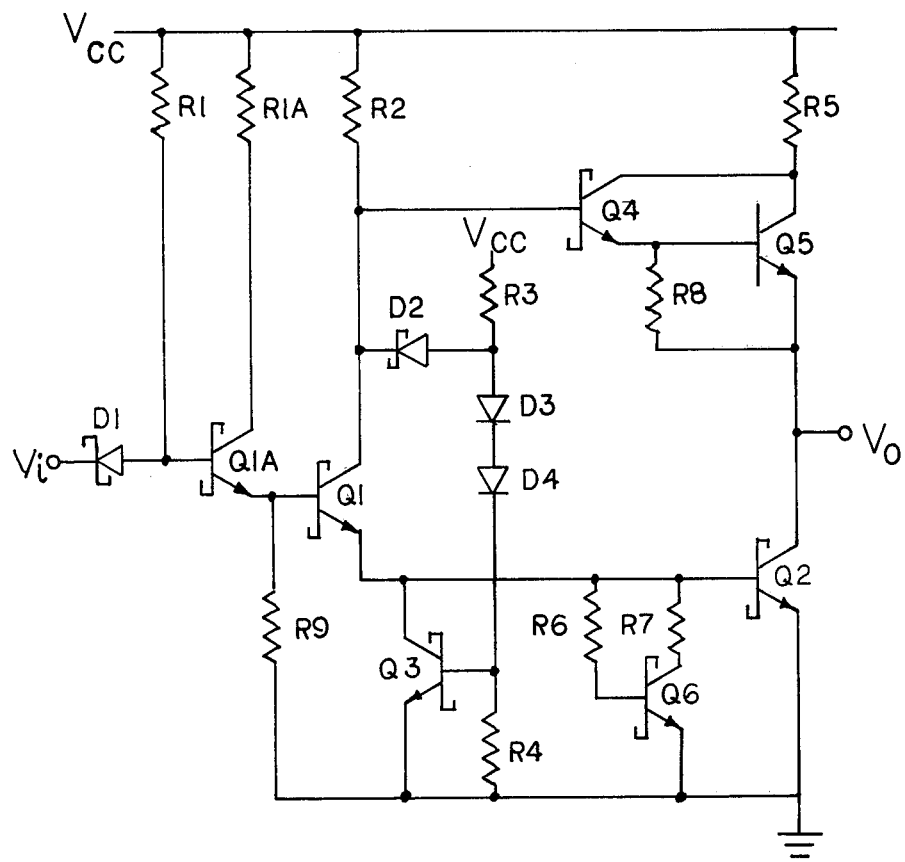
FIG. 2 is a schematic diagram of a Schottky transistor logic output device but modified in accordance with the present invention by the addition of components Q3, D2, D3, D4, R3 and R4.

In FIG. 2 there is illustrated a Schottky TTL output gate 20 modified according to the present invention. The elements of the device include the pullup element Darlington transistor pair Q4 and Q5, pulldown element Q2 with squaring network Q6, R6 and R7 at the base of pulldown transistor Q2, and two gain stage phase splitter consisting of transistors Q1A and Q1. This output device is similar to the low power Schottky TTL output gate described with reference to FIG. 1 except that an additional stage of gain transistor Q1A, has been added to the phase splitter element. Thus, components in FIG. 2 performing the same function as described above with reference to FIG. 1 are similarly designated and an additional stage of gain for the phase splitter element has been added by way of transistor Q1A. A high level voltage at the input $V_i$ corresponding to a binary 1 permits Q1A and Q1, then Q2 to conduct with three stages of current gain, sinking current from the output $V_o$ and clamping the output to a low level voltage corresponding to a binary 0. With Q1 conducting the pullup element Darlington transistor pair Q4 and Q5 are deprived of base drive current and transistors Q4 and Q5 turn off. Current from high level voltage supply $V_{cc}$ is therefore no longer sourced to the output $V_o$.

With a low level voltage corresponding to binary 0 at the input $V_i$, diode D1 conducts depriving the two stage phase splitter transistors Q1A and Q1 of base current so that they turn off. With Q1 not conducting, voltage rises at the base of Q4 delivering base current so that Q4 becomes conducting, turning on Q5 and sourcing current from $V_{cc}$ to the output $V_o$. At the same time pulldown transistor Q2 begins to turn off so that the output voltage can rise to high level binary 1.

To the advanced Schottky output device as described above, the present invention adds the components Q3, D2, D3, D4, R3 and R4, all illustrated in FIG. 2. The purpose of these added components is to provide an active element at the base of the pulldown element transistor Q2 for discharging parasitic Miller feedback current at the base of Q2 during low to high transitions at the output $V_o$ and while Q2 is supposed to be not conducting. This is accomplished as hereafter described by connecting the active element discharge transistor Q3 through inversion coupling to the phase splitter Q1. Phase splitter Q1 controls the conducting state of the pulldown element transistor Q2, in a direct coupling. Thus, when phase splitter transistors Q1A and Q1 are conducting, pulldown transistor Q2 is conducting. Transistors Q2, Q1A and Q1 are therefore in phase. However, when Q2 is conducting to maintain the low potential signal at the output $V_o$, a low impedance path to ground through Q3 is to be avoided, so Q3 must be non-conducting. And, when pulldown transistor Q2 is not conducting or turning off, a low impedance route to ground from the base of Q2 is desirable for diverting and discharging parasitic feedback capacitive coupling current and therefore discharge transistor Q3 should be conducting. Active element discharge transistor Q3 on the one hand, and transistors Q2, Q1A and Q1 on the other hand must therefore be out of phase. This inverse relationship between on the one hand the active element discharge transistor means Q3 added in accordance with the present invention, and on the other hand the pulldown element Q2 and phase splitter elements Q1A and Q1, is the basis for the inverse coupling arrangement between Q3 and Q1 shown in FIG. 2.

Thus, the base of discharge transistor Q3 is coupled to follow changes in potential at the collector of the phase splitter transistor Q1 through diodes D3 and D4 oriented with the forward conduction in the direction of the base of Q3, and through Schottky diode D2 oriented with forward conduction in the direction of the collector of Q1. At the junction of oppositely directed diodes D2 and D3 the power supply voltage $V_{cc}$ is coupled through resistor R3. Therefore, current from R3 can provide base drive current to the discharge transistor Q3 when the lower impedance path through D2 is blocked by phase splitter transistor Q1, i.e. when phase splitter transistor Q1 is not conducting.

The operation of Q3 is controlled by D2, D3, D4, R3, and R4. When a low level signal appears at the input to force a transition to high potential at the output, phase splitters Q1A and Q1 turn off. As the collector of phase splitter transistor Q1 rises in voltage, D2 ceases to conduct the current from R3. D3 and D4 begin to conduct and turn Q3 on. At the same time the Darlington transistor pair Q4 and Q5 turns on sourcing current to the output $V_o$. Q3 now in the conducting state, affords a low impedance path for diverting parasitic capacitive Miller feedback current away from the base of pulldown element Q2 which should remain non-conducting.

On the other hand, when phase splitter transistor Q1 is conducting, current from R3 otherwise headed toward to the base of Q3 is discharged through D2 and Q1 so that discharge transistor Q3 is not conducting. Thus when the input requires a low at the output, Q1A and Q1 turn on. As Q1's collector current commences the voltage at its collector falls. D2 also becomes conducting and diverts all the current away from D3 and D4. With no voltage bias, resistor R4 discharges the base of Q3 and Q3 turns off. The collector voltage of Q3 rises as Q3 becomes a high impedance and base drive current from the emitter of phase splitter Q1 turns on the pulldown element Q2. The emitter current of Q1 thus drives Q2 to pull the output to a low state. The active element Q3 added in accordance with the present invention does not affect the low state of the output device.

With Q1 not conducting, diode D2 blocks current from R2 which would otherwise pass through D3 and D4, so that current from R2 drives the base of the Darlington pair pullup element Q4 and Q5. The reason that both diodes D3 and D4 are used to the base of Q3 is apparent in the situation when Q1 is conducting. When Q1 is conducting, the voltage drop through the path defined by D2, Q1 and Q2 must be less than the total voltage drop through the path defined by D3, D4 and Q3 so that current through R3 is diverted away from the base of Q3 and so that Q3 remains non-conducting. Where the voltage drops across the Schottky diode D2, saturated collector to emitter path of Q1, and base/emitter junction of Q2 are represented by $V_{sd}$, $V_{sat}$, and $V_{be}$ respectively, and where the regular diode junctions are PN junctions equivalent in voltage drop to the base/emitter transistor PN junction represented by $V_{be}$, the following condition must be satisfied with Q1 conducting:

$$V_{sd} + V_{sat} + V_{be} < 3V_{be}$$

The $3V_{be}$ represents the total voltage drop over the path through D3, D4 and Q3 to ground. Because $V_{be}$ is approximately 0.8 volts, $V_{sd}$ approximately 0.6 volts, and $V_{sat}$ approximately 0.3 volts, both diodes D3 and D4 are required to satisfy the inequality. R3 is chosen small enough to supply current for turning on Q3, for example approximately 8K, still greater than the phase splitter supply transistor R2 which is approximately 1.5K.

Figure 3A:
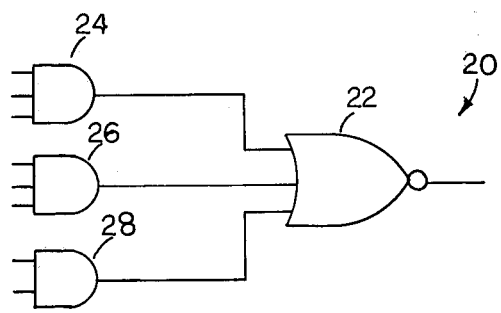
FIG. 3 is a schematic diagram of an application of the present invention in a logic circuit of the type shown in the logic diagram of FIG. 3A.

A further example of implementation of the improved circuit for TTL output devices in accordance with the present invention is illustrated in FIGS. 3 and 3A. In that example the output device is included in a logic circuit 20 of three "AND" gates 24, 26, and 28 coupled into a "NOR" gate 22. In the detailed schematic diagram of FIG. 3 the NOR gate comprises most of the TTL output device in accordance with the present invention with the exception that instead of one phase splitter element there are three parallel phase splitters Q11, Q12, and Q13 in order to effect the logic function of the three inputs to the gate. All the remaining components of NOR gate 26 operate in the manner heretofore described and are therefore similarly designated. Feedback diode D9 is added to enhance switching speed and for sinking current from load capacitance during transition from low to high at the output. Components added in accordance with the present invention, i.e. Q3, D2, D3 and D4, with the 8K resistor for R3 and the 3.5K resistor for R4 are all indicated on the diagram and all function as heretofore described. Other aspects of this circuitry and its application would be apparent to those skilled in the art of TTL output devices.

The present invention and patent application disclose the broad generic concept of providing an active element coupled at the base of the pulldown element transistor to define a route to ground of high or low impedance according to the conducting state of the active element, for the purpose of providing a low impedance for diverting to ground, parasitic Miller current from the base of the pulldown element when the output is at high potential or in transition from low to high, and for the purpose of providing a high impedance when the output is at low potential in order not to affect the low state. The particular species of this broad concept here disclosed as the preferred embodiment comprises an active element at the base of the pulldown element controlled by the state of the phase splitter through an inverse coupling so that the active element is out of phase with the phase splitter. Another species of this broad concept is described in U.S. Pat. application Ser. No. 034,380, filed Apr. 30, 1979, inventor Robert W. Bechdolt, and assigned to the common assignee of the present invention. In the species there disclosed, the active element discharge transistor at the base of the pulldown element is controlled by capacitive coupling means coupled at the base of the active element to follow changes in voltage at the output of the device and capacitively feed back current during transition from low to high at the device output for driving the base of the discharge transistor thereby providing a low impedance path to ground or low potential at the base of the pulldown element transistor for diverting and discharging capacitive Miller feedback current. While the two species by these different inventors described above are patentably distinct, the generic claim is presented in the present patent application because of the priority of invention by the inventor, Paul J. Griffith, in the present case.

While the preferred embodiment of the present invention has been described with reference to particular examples, it is apparent that they have application in a wide variety of circuits including low power Schottky, regular and advanced Schottky, and isoplanar technologies, of the kind, for example further described in the article "Oxide Isolation Builds a Better Schottky TTL" by Bob Bechdolt, Dave Ferris, and Paul Griffith of Fairchild Semiconductor Digital Division, South Portland, Maine, a division of Fairchild Camera and Instrument Corp., Mountain View, Calif., published in the Mar. 1, 1979, issue of *Electronics*. Further account of technologies for implementing the present invention is found in the Fairchild *TTL Data Book* of Fairchild Camera and Instrument Corp., 464 Ellis Street, Mountain View, Calif., 94042, copyright 1978.

What is claimed is:

1. In a transistor logic output device of the type comprising an input and an output for binary data signals of high and low potential, pullup element for sourcing current to the output from high potential, pulldown element for sinking current from the output to low potential, phase splitter element coupled at the input to control the pullup and pulldown elements, said elements comprising junction transistor means, the improvement comprising:

active elements means having a high impedance state when the active element is not conducting and a low impedance state when the active element is conducting, said active element means coupled at the base of the pulldown element transistor means to define a route to ground or low potential of high or low impedance according to the conducting state of the active element means;

and means controlling the conducting state of said active element means for diverting to ground or low potential, Miller feedback current at the base of the pulldown element generated by potential changes from low to high at the output of the device, and for providing a high impedance when the output is at low potential, the pulldown element is conducting, and current is being supplied by the phase splitter element to the base of the pulldown element;

said active element means comprising an inverse coupling between the active element means and the phase splitter element whereby the active element means is conducting when the phase splitter element is not and whereby the active element means is not conducting when the phase splitter element is, the base of said active element means being coupled to a voltage source through at least first and second diodes, said voltage source also being coupled through at least a third diode to the collector of the phase splitter element for diverting current from the base of the active element means when the phase splitter element is conducting, said diodes selected so that the voltage drop over the path from said voltage source through the third diode, phase splitter element and pulldown element is less than the voltage drop over the path from the voltage source through the first and second diodes and the active element means when the phase splitter element is conducting.

2. In a transistor logic output device of the type comprising an input and an output for binary data signals of high and low potential, pullup element for sourcing current to the output from high potential, pulldown element for sinking current from the output to low potential, phase splitter element coupled at the input to control the pullup and pulldown elements, said elements comprising junction transistor means, the improvement comprising:

active element means having high and low impedance states, said active element coupled at the base of the pulldown element transistor means to define a route to ground or low potential of high or low impedance;

said active element means inversely coupled to the phase splitter element and controlled by the conducting state of the phase splitter element so that the active element means defines a low impedance route to ground when the phase splitter element is not conducting and a high impedance route to ground when the phase splitter element is conducting;

whereby Miller feedback current at the base of the pulldown element is diverted to ground during low to high transition at the output of the device thereby enhancing speed of transition and turn off of the pulldown element;

said active element means comprising active element discharge transistor means having the base thereof coupled through first diode voltage drop means to a voltage source, said first diode means oriented with forward conduction in the direction of the active element means and said voltage source coupled through second diode means to the collector of the phase splitter element for diverting current from said voltage source through the phase splitter element when the phase splitter element is conducting, said second diode means oriented with forward conduction in the direction of the phase splitter element thereby blocking current flow through the first diode means.

3. A transistor logic output device as set forth in claim 2 wherein the voltage drop across said first diode means is selected so that when the phase splitter element is conducting the voltage drop from said voltage source through the phase splitter element path to ground is less than the voltage drop from said voltage source through the active element means path to ground.

4. A transistor logic output device as set forth in claim 3 wherein said first diode means comprises at least two diodes in series.

5. A new and improved transistor logic output device comprising:

an input for receiving binary data signals in the form of high and low potential states;

a pullup element comprising transistor means for sourcing current from high potential to the output when the pullup transistor means is conducting;

a pulldown element comprising transistor means for sinking current from the output to low potential when the pulldown transistor means is conducting;

phase splitter element comprising transistor means coupled between the data signal input on the one hand and the pullup and pulldown elements on the other hand for alternately controlling the conducting state or phase of the pullup and pulldown elements thereby alternately to source or sink current at the output in accordance with binary data signals at the input;

an active element for discharging capacitive feedback Miller current comprising transistor means coupled between the base of the pulldown element transistor means and ground or low potential for providing and actively controlling the impedance of a route to ground or low potential for diverting and discharging the capacitive feedback Miller current resulting from base-collector junction capacitance in the pulldown element transistor means which Miller current occurs during the low to high potential transition at the output of the device;

said active element controlled by the state of the phase splitter element through an inverse coupling to said phase splitter;

said active element comprising discharge transistor means having the base thereof coupled to a current source through voltage drop first diode means, said current source also coupled to the collector of the phase splitter element through second diode means.

6. In a transistor logic output device of the type comprising an input and an output for binary data signals of high and low level potential, pullup element for sourcing current to the output from high potential, pulldown element for sinking current from the output to low potential, phase splitter element coupled at the input to control the pullup and pulldown elements, said elements comprising junction transistor means, the improvement comprising:

active element discharging transistor means coupled between the base of the pulldown element transistor means and ground or low potential for actively controlling a route to ground or low potential for diverting and discharging the so-called capactive feedback Miller current generated during the low to high potential transition at the output of the device and resulting from base-collector junction capacitance in the pulldown element transistor means;

said active element coupled to a potential source in the device for driving the active element to conduction when the output of the device is at high potential or in transition from low to high potential said active element coupled to the potential source through voltage drop first diode means, said potential source coupled to the collector of the phase splitter element through second diode means.

* * * * *